(12) United States Patent
Criscuolo et al.

(10) Patent No.: US 6,503,841 B1
(45) Date of Patent: Jan. 7, 2003

(54) OXIDE ETCH

(75) Inventors: Robert William Criscuolo, Nazareth, PA (US); Charles Walter Pearce, Emmaus, PA (US)

(73) Assignee: Agere Systems Inc., Allentown, PA (US)

( * ) Notice: Subject to any disclaimer, the term of this patent is extended or adjusted under 35 U.S.C. 154(b) by 97 days.

(21) Appl. No.: 09/611,844

(22) Filed: Jul. 7, 2000

(51) Int. Cl.[7] .................. H01L 21/225; H01L 21/311
(52) U.S. Cl. .................. 438/705; 438/756; 438/914; 216/41; 216/97; 216/99
(58) Field of Search .............. 216/41, 83, 97, 216/99; 438/705, 745, 756, 914

(56) References Cited

U.S. PATENT DOCUMENTS

| | | | | |
|---|---|---|---|---|
| 4,315,782 A | * | 2/1982 | Tarng ................. | 148/DIG. 128 |
| 5,028,564 A | * | 7/1991 | Chang et al. ......... | 148/DIG. 31 |
| 5,214,283 A | * | 5/1993 | Le ..................... | 250/307 |
| 5,326,626 A | * | 7/1994 | Chidsey et al. ....... | 427/165 |
| 5,434,104 A | * | 7/1995 | Cain et al. ........... | 204/192.17 |
| 5,468,871 A | * | 11/1995 | Ebel et al. ........... | 548/373.1 |
| 5,685,951 A | * | 11/1997 | Torek et al. .......... | 134/1.3 |
| 5,885,903 A | | 3/1999 | Torek et al. | |
| 5,918,129 A | * | 6/1999 | Fulford et al. ........ | 438/289 |
| 5,926,717 A | * | 7/1999 | Michael et al. ....... | 438/387 |
| 5,930,650 A | | 7/1999 | Chung et al. | |
| 5,963,803 A | * | 10/1999 | Dawson et al. ....... | 257/368 |
| 5,990,019 A | * | 11/1999 | Torek et al. .......... | 134/1.3 |
| 6,004,878 A | * | 12/1999 | Thomas et al. ....... | 257/344 |
| 6,051,870 A | | 4/2000 | Ngo | |
| 6,121,100 A | * | 9/2000 | Andideh et al. ....... | 257/336 |
| 6,194,320 B1 | * | 2/2001 | Oi ..................... | 216/47 |
| 6,225,222 B1 | * | 5/2001 | Yang et al. ........... | 438/396 |

FOREIGN PATENT DOCUMENTS

WO     WO 98/49719     11/1998

\* cited by examiner

*Primary Examiner*—Randy Gulakowski
*Assistant Examiner*—Jiri Smetana

(57) ABSTRACT

The invention includes a method of etching silicon dioxide, comprising doping a layer of silicon dioxide to form a layer of doped silicon dioxide and etching the doped silicon dioxide layer with phosphoric acid.

21 Claims, 4 Drawing Sheets

OXIDE ETCH

FIELD OF THE INVENTION

The invention relates to etching oxides, particularly oxides found in integrated circuits.

BACKGROUND OF THE INVENTION

The need to etch silicon dioxide comes up frequently in the fabrication of integrated circuits and photonics. Typically, HF which is dangerous to people and an environmental hazard is used. HF also has technical drawbacks.

For example, silicon nitride is commonly used as an oxidation mask in processes termed "LOCOS" (localized oxidation of silicon). In a LOCOS process, areas covered by nitride are not oxidized although the nitride does convert to oxide albeit at a slow rate. Following the oxidation process, current practice is to remove the oxide formed on the nitride by immersion in HF acid. This is done to allow the subsequent removal of the nitride in phosphoric acid. This removal of the oxide from the nitride surface unavoidably and undesirably etches the oxide formed in the areas that were intentionally oxidized, such as the field oxide.

Also, consider an optical device, such as a micro electromechanical system (MEMS) mirror array. It is often desired to make one or more regions in a silicon dioxide substrate where the silicon dioxide is a different height than the substrate. This has been done by timed etch, but better and more controllable results are had by providing an HF resistant etch stop layer such as SiN (silicon nitride) during the deposition of the silicon dioxide to provide a $SiO_2/SiN/SiO_2$ sandwich. The top layer is patterned with photoresist and HF or other fluorinated compounds are used to etch down to the SiN. While the SiN may then be etched away locally by phosphoric acid, a layer of SiN remains buried in the unetched $SiO_2$ areas. If these areas are then used to transmit light, provided with a back-surface reflector, undesirable light loss will occur due to the SiN having a different refractive index than the $SiO_2$.

SUMMARY OF THE INVENTION

The invention includes a method of etching silicon dioxide, comprising doping a layer of silicon dioxide to form a layer of doped silicon dioxide and etching the doped silicon dioxide layer with phosphoric acid.

BRIEF DESCRIPTION OF THE DRAWINGS

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures.

DETAILED DESCRIPTION OF THE INVENTION

To eliminate the use of HF, the present invention dopes silicon dioxide, the doped silicon dioxide surprisingly being soluble in phosphoric acid, a much more environmentally benign material than HF.

One embodiment of the invention comprises diffusing LOCOS processed wafers with phosphorus to convert the silicon dioxide to a phosphorous rich glass (p-glass). The p-glass will etch in phosphoric acid which eliminates the need for the HF step. The phosphoric acid bath has an etch ratio selectivity of the p-glass to the oxide equaling or exceeding 100:1. This reduces the unneeded and detrimental etching of the desired oxide (the field oxide) in the HF acid. The amount of oxide removed is limited to that converted to P-glass.

Figure 1:
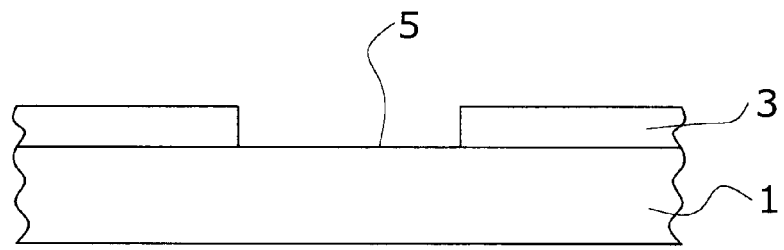
FIG. 1 is a cross-sectional view of a silicon substrate with patterned SiN on top, for one embodiment of the invention.
Figure 2:
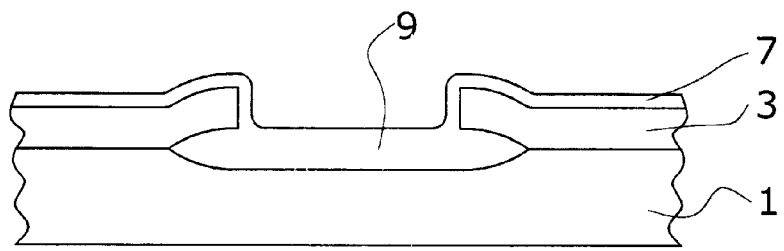
FIG. 2 is a view of the above after field oxide growth, which also causes a silicon dioxide skin on the SiN, for one embodiment of the invention.
Figure 3:
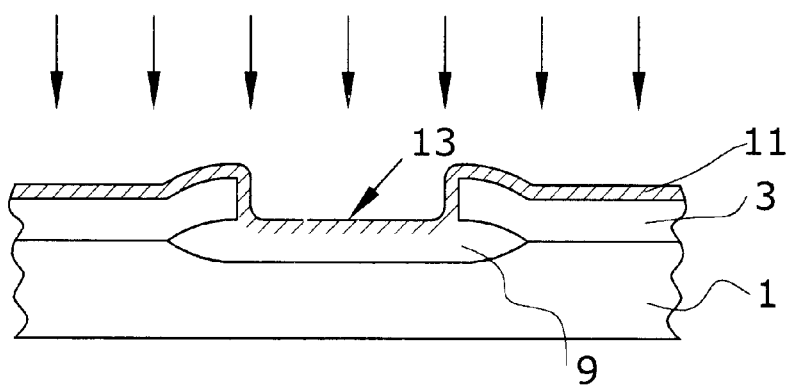
FIG. 3 shows the above after doping, which dopes the entire thickness of the skin with more than $10^{20}$ atoms dopants/cm$^3$, but only dopes the surface of the field oxide, for one embodiment of the invention.
Figure 4:
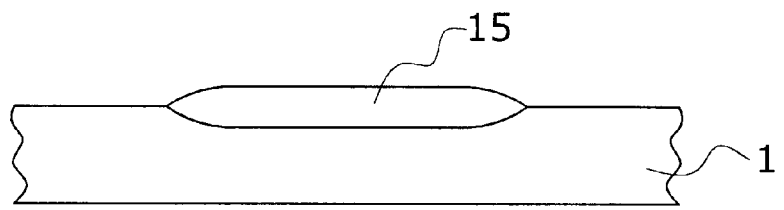
FIG. 4 shows the above after phosphoric acid etch, which removes all of the doped skin and all of the SiN, but only the top surface of the field oxide, for one embodiment of the invention.
Figure 14:
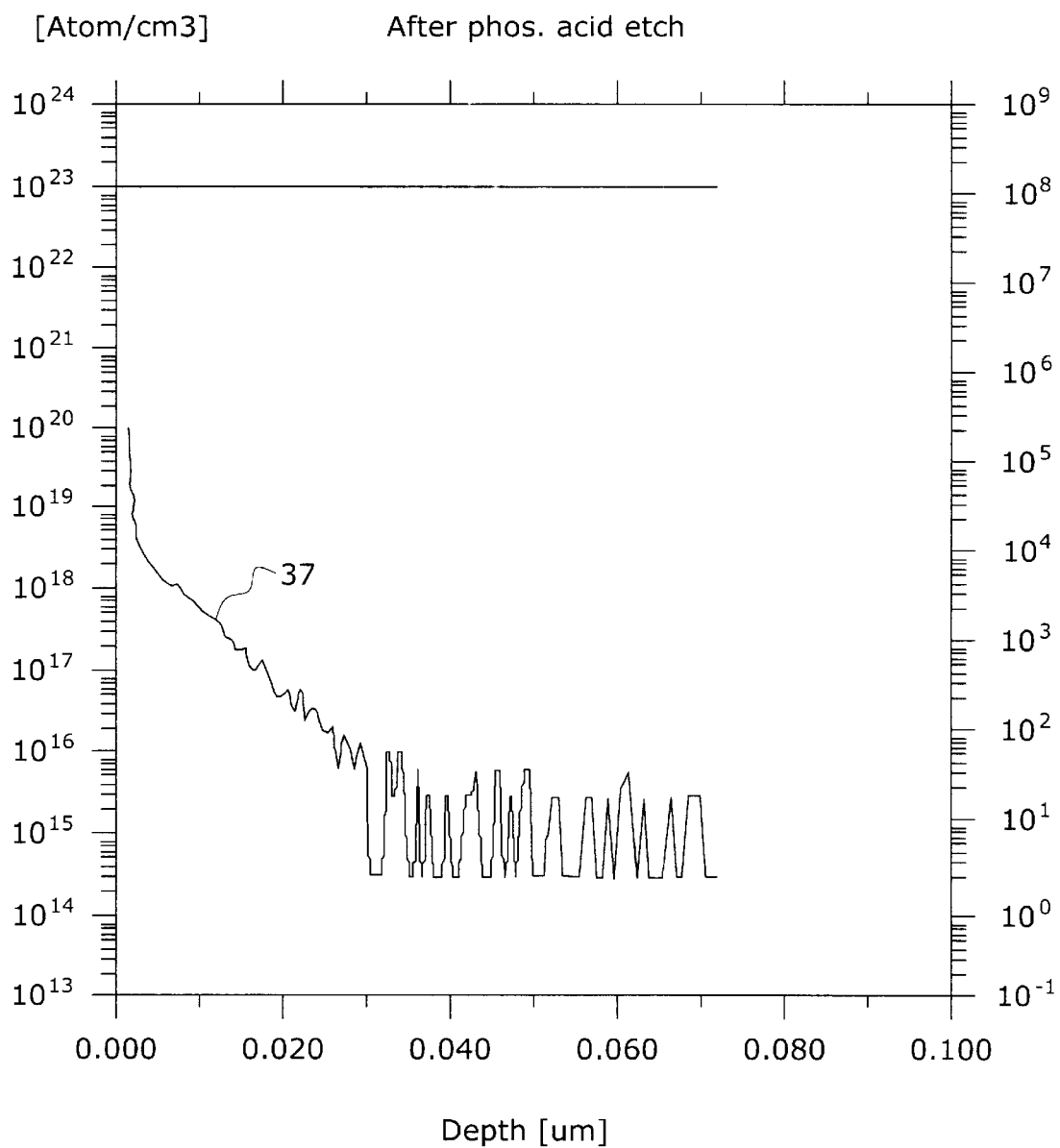
FIG. 14 shows the residual dopant profile in an etched surface for an embodiment of the invention.

Referring now to the drawing, wherein like reference numerals refer to like elements throughout, FIG. 1, shows a silicon substrate 1 having a layer of SiN 3, patterned to leave a window 5 over a portion of the silicon substrate 5. Thermal oxidation is then used to grow the field oxide 9, but also converts some of the exposed surface of SiN 3 to a silicon dioxide skin 7, as shown in FIG. 2. Typically, the field oxide 9 can be 500 nm thick, while the oxide skin 7 is on the order of 1–10 nm, depending on the oxidation conditions. The oxide skin 7 and field oxide 9 are then doped to form a doped oxide skin 11 and a doped surface region 13 of the field oxide 9, as can be seen in FIG. 3. The doping dopes the entirety of the thickness of the oxide skin 7, but only the surface 13 of the field oxide 9. The doping is preferably diffusion doping. A useful doping temperature range is 800–1075 C., preferably 850–900 C. and most preferably 850 C. Doping times, as will be appreciated by the practitioner, are a function of the doping temperature and the amount of field oxide grown, but the 10 to 40 minute range has been found to work at 850 C. Both phosphorus and boron may be used, both used together are preferred, phosphorus is most preferred. Any of the common phosphorus precursors such as phosphine and phosphorus oxychloride may be used. Phosphorus tribromide is preferred. Doping by ion implantation followed by an anneal may also be employed. The doped oxide skin 11 and the field oxide doped surface 13 are then etched by contacting them with phosphoric acid. A phosphoric acid bath made from readily available 85% weight acid is boiled down to 92% weight (balance water). The phosphoric acid etch removes the doped oxide skin 11, the SiN 3 and the field oxide doped surface 13. Note that there is a level of doping below which etching will not occur. This is about $10^{20}$ atoms/cm$^3$ or 40 ppm for phosphorus. The remaining field oxide will retain a Fickian diffusion tail 37 of phosphorus, with a concentration of about $10^{20}$ atoms/cm$^3$ at the surface of the field oxide tapering towards $10^{16}$ atoms/cm$^3$ and then, except for the inevitable impurities, zero in the bulk of the oxide, as can be seen in the secondary mass spectroscopy results of FIG. 14.

Figure 5:
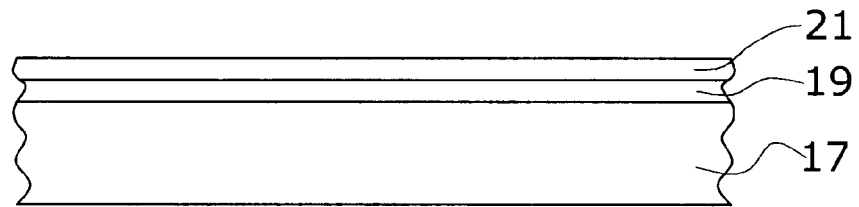
FIG. 5 is a cross-sectional view showing a substrate comprising silicon dioxide, covered with hardmask and photoresist, for another embodiment of the invention.
Figure 6:
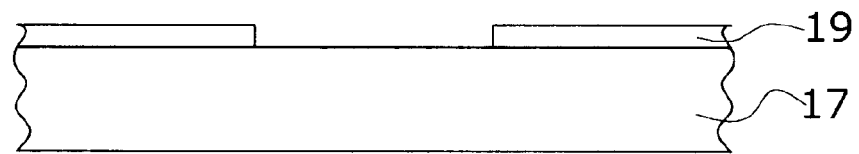
FIG. 6 is a view of the above after photoresist patterning, hardmask etch and photoresist removal, for another embodiment of the invention.
Figure 7:
FIG. 7 is a view of the above after doping the silicon dioxide to form a doped region, for another embodiment of the invention.
Figure 7:
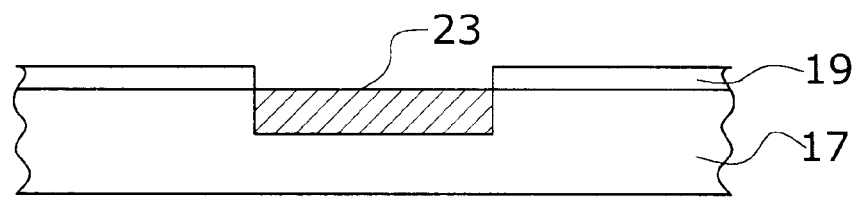
Figure 8:
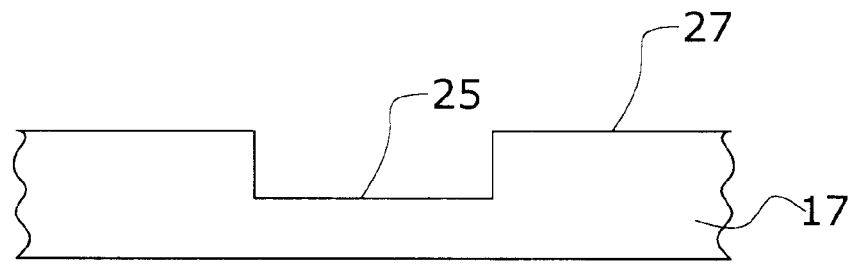
FIG. 8 is a view of the above after phosphoric acid etch, which removes the hardmask and doped region, for another embodiment of the invention.

This selective etching method may also be applied to the deglazing of phosphorous diffusions where an oxide layer will be left behind and has utility in MEMS and micromachining processes. In another embodiment of the invention, silicon dioxide can be patterned, doped and etched to form a structure having more than one height of silicon dioxide. FIG. 5 shows a substrate comprising silicon dioxide 17, hardmask 19 and photoresist 21. The silicon dioxide may be thermally grown from underlying silicon, applied as spin-on glass, deposited by plasma enhanced tetraethylorthosilicate, or supplied as a glass sheet, for example. The hardmask is preferably one etched by phosphoric acid, such as SiN. FIG. 6 shows the above after patterning the photoresist 21, etching the hardmask 19 and removing the photoresist 21. Doping is then done, as shown in FIG. 7, to form a doped region 23 in the silicon dioxide. Phosphoric acid etching is then done to remove the doped region 23, as shown in FIG. 8. Note that the exposed surface 25 will have a dopant diffusion tail buried in it as described above, while the higher silicon dioxide surface 27 will, except for the inevitable impurities, be free of dopant.

Figure 9:
FIG. 9 is a cross-sectional view showing a substrate comprising silicon dioxide, for yet another embodiment of the invention.
Figure 10:
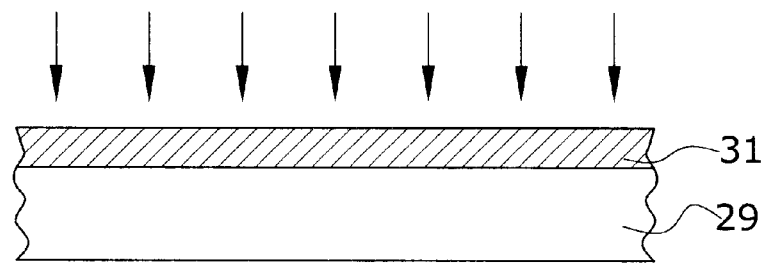
FIG. 10 is a view of the above after doping the silicon dioxide to form a doped region, for yet another embodiment of the invention.
Figure 11:
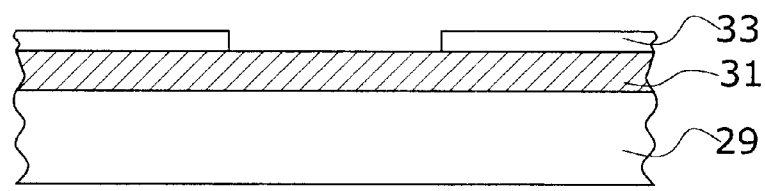
FIG. 11 is a view of the above after photoresist patterning, for yet another embodiment of the invention.
Figure 12:
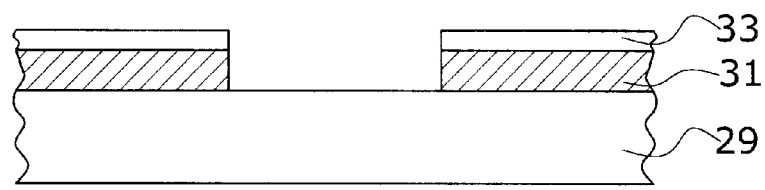
FIG. 12 is a view of the above after etching to remove the doped region, for yet another embodiment of the invention.
Figure 13:
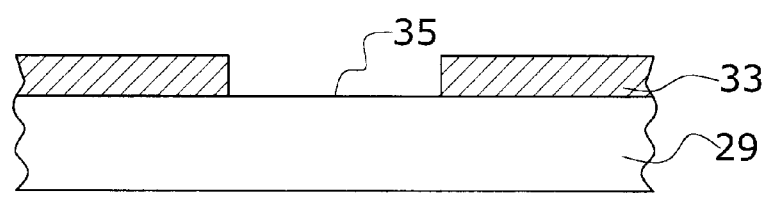
FIG. 13 is a view of the above after photoresist removal, for yet another embodiment of the invention.

A structure similar to that described above by doping first, masking, and then etching may be made. FIG. 9 shows a silicon dioxide comprising substrate 29, which is then doped to form a doped region 31, as shown in FIG. 10. Photoresist 33 is applied and patterned as shown in FIG. 12. Phosphoric acid etching is done to remove a portion of the doped region 31. The photoresist 33 is removed to yield the structure shown in FIG. 13. Surface 35 will have a diffusion tail embedded in it as described above. However, in contrast to the prior method, region 31 will have residual doping greater than $10^{20}$ atoms dopant/cm$^3$.

EXAMPLE 1

A layer of silicon dioxide was diffusion doped by exposing it to phosphorus tribromide at 850 C. for 40 minutes. The doped silicon dioxide was then etched in a bath comprising 92% by weight phosphoric acid and 8% by weight water at 165 C. for 60 minutes. The water content was maintained by drip.

EXAMPLE 2

As in Example 1, but the duration of doping was 10 minutes.

EXAMPLE 3

Boron phosphorus doped silicate glass was etched in phosphoric acid as in Example 1.

Although the invention has been described with reference to illustrative embodiments, it is not limited to those embodiments. Rather, the appended claims should be construed to include other variants and embodiments of the invention that may be made by those skilled in the art without departing from the true spirit and scope of the present invention

What is claimed is:

1. A method of etching silicon dioxide comprising the steps of:
   forming a silicon dioxide surface layer on a substrate;
   depositing a hardmask over said silicon dioxide surface layer;
   patterning photoresist on the hardmask to leave at least some exposed silicon dioxide;
   doping the exposed silicon dioxide to a doping concentration of greater than $10^{20}$ atoms/cm$^3$ to form a doped silicon dioxide region across a surface portion of said layer; and
   etching said doped silicon dioxide region and hardmask with phosphoric acid.

2. The method as defined in claim 1 wherein the silicon dioxide is doped with phosphorus.

3. The method as defined in claim 1 wherein the silicon dioxide is doped with boron.

4. The method as defined in claim 1 wherein the doping is performed by diffusing the dopant into the silicon dioxide.

5. The method as defined in claim 4 wherein the diffusion is performed at a temperature in the range of 800 to 1075° C.

6. The method as defined in claim 5 wherein the diffusion is performed at a temperature of approximately 850° C.

7. The method as defined in claim 4 wherein the diffusion is performed for a time period in the range of approximately 10 to 40 minutes.

8. A method of etching silicon dioxide comprising the steps of:
   providing a substrate including a surface layer of silicon dioxide;
   doping a top portion of said silicon dioxide surface layer to a doping concentration of greater than $10^{20}$ atoms/cm$^3$ to form a doped silicon dioxide region;
   patterning photoresist over said doped silicon dioxide region to leave at least some exposed surface areas of said doped silicon dioxide region; and
   etching the exposed surface areas of said doped silicon dioxide with phosphoric acid.

9. The method as defined in claim 8 wherein the silicon dioxide is doped with phosphorus.

10. The method as defined in claim 8 wherein the silicon dioxide is doped with boron.

11. The method as defined in claim 8 wherein the doping is performed by diffusing the dopant into the silicon dioxide.

12. The method as defined in claim 11 wherein the diffusion is performed at a temperature in the range of 800 to 1075° C.

13. The method as defined in claim 12 wherein the diffusion is performed at a temperature of approximately 850° C.

14. The method as defined in claim 11 wherein the diffusion is performed for a time period in the range of approximately 10 to 40 minutes.

15. A method of etching silicon dioxide comprising the steps of:
   patterning silicon nitride on a silicon substrate surface, leaving at least some portions of the surface exposed;

forming silicon dioxide on the silicon substrate to form a field oxide in the exposed portions and a silicon dioxide skin layer on the patterned silicon nitride surface;

doping the field oxide and the silicon dioxide skin layer to comprise a doping concentration greater than $10^{20}$ atoms/cm$^3$; and etching the doped silicon dioxide and the patterned silicon nitride with phosphoric acid.

16. The method as defined in claim 15 wherein the silicon dioxide is doped with phosphorus.

17. The method as defined in claim 15 wherein the silicon dioxide is doped with boron.

18. The method as defined in claim 15 wherein the doping is performed by diffusing the dopant into the silicon dioxide.

19. The method as defined in claim 18 wherein the diffusion is performed at a temperature in the range of 800 to 1075° C.

20. The method as defined in claim 20 wherein the diffusion is performed at a temperature of approximately 850° C.

21. The method as defined in claim 18 wherein the diffusion is performed for a time period in the range of approximately 10 to 40 minutes.

* * * * *